United States Patent [19]
Grande et al.

[11] Patent Number: 5,851,709
[45] Date of Patent: Dec. 22, 1998

[54] METHOD FOR SELECTIVE TRANSFER OF A COLOR ORGANIC LAYER

[75] Inventors: William J. Grande, Pittsford; Paul J. Fleming, Lima; Ching W. Tang, Rochester, all of N.Y.

[73] Assignee: Eastman Kodak Company, Rochester, N.Y.

[21] Appl. No.: 961,808

[22] Filed: Oct. 31, 1997

[51] Int. Cl.$^6$ .................................................. G02B 5/20
[52] U.S. Cl. .............................. 430/7; 430/200; 430/201
[58] Field of Search ............................. 430/7, 200, 201, 430/321

[56] References Cited

U.S. PATENT DOCUMENTS

| | | |
|---|---|---|
| 4,769,292 | 9/1988 | Tang . |
| 4,911,733 | 3/1990 | Matsumoto et al. ..................... 8/471 |
| 5,405,709 | 4/1995 | Littman et al. . |
| 5,521,035 | 5/1996 | Wolk et al. ............................. 430/2 |
| 5,576,265 | 11/1996 | De Boer et al. ..................... 503/227 |
| 5,683,823 | 11/1997 | Shi et al. . |

OTHER PUBLICATIONS

J.K. Bhardwaj and H. Ashraf, titled "Advanced Silicon Etching Using High Density Plasmas," SPIE: Micromachining and Microfabrication Process Technology, vol. 2639, pp. 224–233.

Primary Examiner—John A. McPherson
Attorney, Agent, or Firm—Raymond L. Owens

[57] ABSTRACT

A method for selective transfer of a color organic layer from a donor layer onto a device having an array of pixels with each pixel formed from color subpixels, includes the steps of providing a substrate having opposing first and second surfaces; forming a light transmissive heat insulating layer over the first surface of the substrate; forming a light absorbing layer over the heat insulating layer; providing the substrate with an array of openings extending from the second surface to the heat insulating layer, the number and positions of the openings corresponding to the number and positions of the color subpixels of the device, and each opening having a size equal to or smaller than the size of the color subpixel. The method also includes providing a transferable color forming organic donor layer formed on the light absorbing layer; positioning the device in contact or close proximity to the donor layer in an oriented relationship between the openings in the substrate and the corresponding color subpixels on the device; and employing a source of radiation for producing sufficient heat at the light absorbing layer over the openings to cause the selective transfer of portions of the transferable color forming organic donor layer to the corresponding color subpixels of the device.

14 Claims, 3 Drawing Sheets

METHOD FOR SELECTIVE TRANSFER OF A COLOR ORGANIC LAYER

CROSS REFERENCE TO RELATED APPLICATIONS

The present invention is related to commonly assigned U.S. patent application Ser. No. 08/870,475, filed Jun. 6, 1997, entitled "Patterned Organic Layers in a Full Color Organic Electroluminescent Display Array on a Thin Film Transistor Array Substrate" to Tang; U.S. patent application Ser. No. 08/788,537, filed Jan. 24, 1997, entitled "Method of Depositing Organic Layers in Organic Light Emitting Devices" to Tang et al; and U.S. patent application Ser. No. 08/789,590, filed Jan. 24, 1997, now U.S. Pat. No. 5,756,240, entitled "Method of Making Color Filter Arrays by Transferring Colorant Material" to Roberts et al and assigned to the assignee of the present invention. The disclosure of these related applications is incorporated herein by reference.

FIELD OF THE INVENTION

The present invention relates to methods for selective transfer of a color organic layer from a transferrable color forming organic donor layer to a device having designated red, green, and blue color subpixels.

BACKGROUND OF THE INVENTION

In devices having an array of pixels, and capable of rendering a full color display, it is required to deposit color forming media (for example red, green, and blue color forming media) in precise registration as a color forming pattern onto the pixels of the device. In a solid-state image sensing device, the color forming media are deposited so as to provide a color filter over the pixels. The solid-state image sensing device can be a charge coupled device (CCD) or a complementary metal oxide semiconductor (CMOS) device. In a full color light emitting electroluminescent (EL) device, red, green, or blue color light emitting pixels or subpixels are formed by pixel-selective deposition of red, green, or blue light emitting organic EL media.

In organic EL devices, each color forming EL-medium is comprised of a thin layer of an organic EL host material and, respectively, a red, green, or blue light emitting fluorescent dye. Such layers are neat layers, i.e., the layers do not contain polymeric binders, and the layers have a thickness in the range of from 200 to 1000 Angstrom.

While it has been contemplated to first deposit a neat layer of an EL-medium uniformly on an organic EL device and, subsequently, patterning the uniform layer by a photolithographic method, it has been found that standard photolithographic methods are incompatible with such EL layers. Accordingly, for relatively large pixel dimensions of an EL device, pixel-selective deposition of an organic EL-medium has evolved as the practice of choice in which the organic EL-medium is vapor deposited onto the EL device through apertures in an aperture mask (also referred to as a shadow mask) held in contact or close proximity to the device surface. Such selective thermal dye transfer techniques are well known, but present uniformity and resolution problems, particularly at smaller pixel dimensions.

Accordingly, it is desirable to provide a method for selective transfer of a color organic EL layer to an EL device which provides the resolution commensurate with relatively small pixel dimensions.

Organic color filter arrays on image sensing devices are currently provided by photolithographic patterning of a predeposited uniform layer of a photolithographic composition which either contains a selected colorant, or into which a colorant can be introduced upon patterning. Such lithographically patternable color filter layers contain a photopolymer material, and have a typical thickness in the range of from 10,000 to 20,000 Angstrom.

It has long been recognized that advantageous features could be obtained in color filter arrays on image sensors if the color filters could be produced from neat layers of absorptive color filter colorants. Pixel-selective deposition of a neat layer of an organic colorant onto an image sensor from a colorant donor sheet is disclosed in the above referenced U.S. patent application Ser. No. 08/789,590, filed Jan. 24, 1997, now U.S. Pat. No. 5,756,240, to Roberts et al. Roberts et al contemplate using a conventional metal-foil aperture mask. However, as pixel dimensions decrease, the use of aperture masks poses problems in that the patterned metal foils, or an assembly of wires used to form the aperture masks, become increasingly fragile and are difficult to manufacture. Additionally, aperture masking techniques, as applied to the pixel selective transfer of neat color filter colorants, have problems of uniformity, pixel resolution, and pixel edge definition at reduced pixel dimensions.

Accordingly, it is desirable to provide a way for selective transfer of an organic colorant layer from a donor layer to an image sensing device commensurate with reduced pixel dimensions.

SUMMARY OF THE INVENTION

It is an object of the present invention to provide a method for selective transfer of a color organic layer from a donor layer to a device having different color subpixels.

This object is achieved by a method for selective transfer of a color organic layer from a donor layer onto a device having an array of pixels with each pixel formed from a number of color subpixels having seleced positions in the array, comprising the steps of:

a) providing a substrate having opposing first and second surfaces;

b) forming a light transmissive heat insulating layer over the first surface of the substrate;

c) forming a light absorbing layer over the heat insulating layer;

d) providing the substrate with an array of openings extending from the second surface to the heat insulating layer, the number and positions of the openings corresponding to the number and positions of the color subpixels of the device, and each opening having a size equal to or smaller than the size of the color subpixel;

e) providing a transferable color forming organic donor layer formed on the light absorbing layer;

f) positioning the device in contact or close proximity to the donor layer in an oriented relationship between the openings in the substrate and the corresponding color subpixels on the device; and g) employing a source of radiation for producing sufficient heat at the light absorbing layer over the openings to cause the selective transfer of portions of the transferable color forming organic donor layer to the corresponding color subpixels of the device.

ADVANTAGES

The present invention provides selective transfer to a device from a color forming organic donor layer bearing structure upon exposure to radiation. The invention employs regions of high radiation absorbance, low thermal mass, and low thermal conductivity where efficient transfer of the color forming organic donor layer to the device is desired, and having regions of high thermal mass, and high thermal conductivity from which transfer of a color forming organic layer is precluded. Major advantages include high pixel resolution and edge definition of transferred layers; excellent utilization of the color forming organic donor layer; precise control of the thickness of each selectively transferred color forming organic layer; in scalability to large area device; and compact deposition tooling.

It will be understood that the drawings are not to scale and have been shown for clarity of illustration.

DETAILED DESCRIPTION OF THE INVENTION

The term "display" is employed to designate a screen capable of electronically displaying video images or text. The term "pixel" is employed in its art recognized usage to designate an area of a display that can be stimulated to emit light independently of other areas. The term "full color" is employed to describe a display which is capable of rendering video images or text in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light within the visible spectrum, with different hues exhibiting visually discernible differences in color. The pixel or subpixel is generally used to designate the smallest addressable unit in a display. The term "subpixel" is employed to designate any portion of a pixel which can be independently addressable to render a specific color. For example, a blue subpixel is that portion of a pixel which can be addressed to provide blue light. In a full color display, a pixel generally comprises three primary color subpixels, namely, blue, green, and red. The term "pitch" is used to designate the distance separating two pixels or two subpixels. Thus, a subpixel pitch means the separation between two subpixels.

Figure 1:
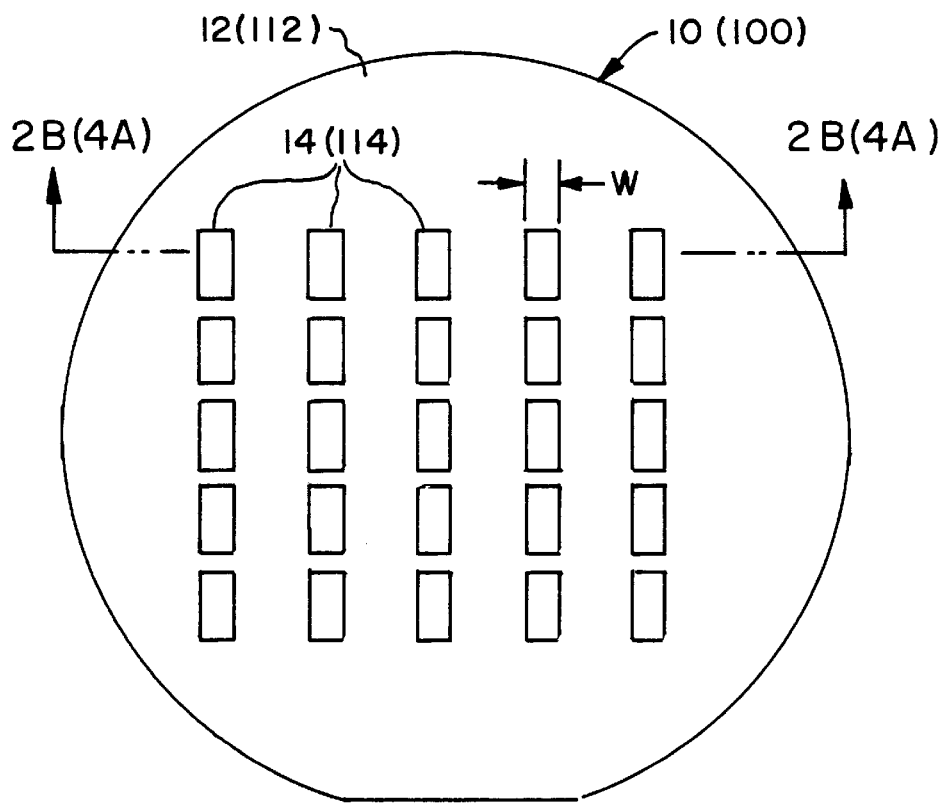
FIG. 1 is a schematic plan view of a silicon wafer substrate viewed from a second surface thereof and showing a plurality of openings therein in accordance with the present invention.

Turning now to FIG. 1, there is shown a schematic plan view of a silicon wafer substrate 10 as viewed from a second surface 12. The substrate 10 has an ordered array of a plurality of openings 14 with each opening having a width dimension W. The width dimension W of the openings can be in a range of from about 1 to about 500 micrometer, and is preferably in a range of from 2 to 300 micrometer commensurate with a range of pixel width dimensions of various classes of image sensing device and of various designs of EL display devices. A line 2B—2B indicates a cross-sectional view of a FIG. 2B, and designations shown in parentheses in FIG. 1 refer to a second embodiment of the method and methods in accordance with the present invention and to be detailed with reference to FIGS. 4A–4D.

A silicon wafer is one preferred substrate for the method of the present invention for the following major reasons: silicon wafers and silicon wafer processing equipment are readily commercially available; recent advances in silicon wafer processing have provided suitable methods in forming deep openings or deep trenches in a silicon wafer by combining standard photolithography with techniques of high density plasma etching as described, for example, in a publication by J. K. Bhardwaj and H. Ashraf, titled "Advanced Silicon Etching Using High Density Plasmas," SPIE: Micromachining and Microfabrication Process Technology, Vol. 2639, p 224–233; silicon wafers exhibit substantial structural integrity and thermal stability under operating conditions experienced by the silicon wafer substrate when used in the apparatus of the present invention; and the two opposing surfaces of a silicon wafer substrate are substantially coplanar and polished, thus permitting deposition of well defined thin films thereon. The microfabrication method can be readily extended to other substrates such as glass and ceramic plates or wafers.

Figure 2A:
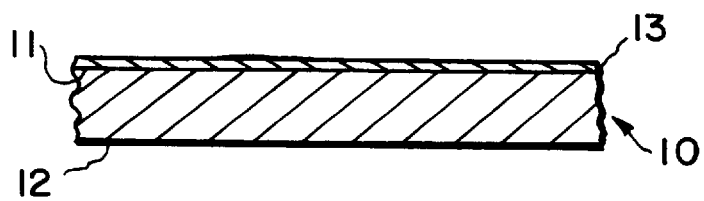
FIG. 2A is a schematic cross-sectional view of a silicon wafer substrate having a heat insulating layer on a first surface thereof in accordance with the present invention.

Turning now to FIG. 2A, there is provided a schematic cross-sectional view of a substrate 10 having a first surface 11 and an opposing second surface 12 with a light transmissive and thermally insulating layer 13 deposited on the first surface 11 of the substrate. The layer 13 should have a low thermal conductivity, or it should be sufficiently thin such that its total thermal mass is small compared with the thermal mass of the wafer substrate. Particularly preferred materials forming layer 13 are silicon dioxide, silicon nitride, silicon oxynitride, and aluminum oxide. The thickness of this layer is preferably in the range of from 0.1 to 50 micrometer.

Figure 2B:
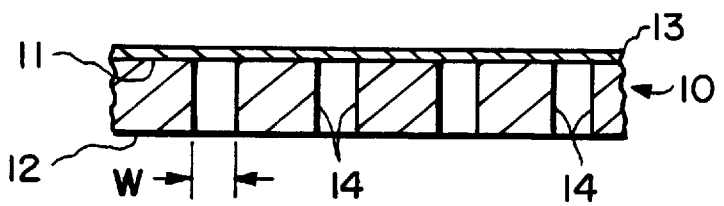
FIG. 2B is a schematic cross-sectional view taken along the lines 2B—2B in FIG. 1 and showing a plurality of openings extending from a second surface of the substrate to the heat insulating layer in accordance with the present invention.

Referring now to FIG. 2B, there is shown a schematic cross-sectional view of the substrate 10 taken along the lines 2B—2B of FIG. 1, depicting periodically spaced openings 14 extending from the second surface 12 to the first surface 11 of the substrate. The openings 14 have a width dimension W, and are formed by the aforementioned high density plasma etching process in which the insulating layer 13 serves as an etch stop for the etch process which is initiated from the second surface 12. The openings 14 are arranged in a pattern which is common with the pattern of the subpixels of a device upon which a color forming organic layer is to be selectively transferred. The width dimension W of the openings 14 is preferably in a range of from 2 to 300 micrometer.

Figure 2C:
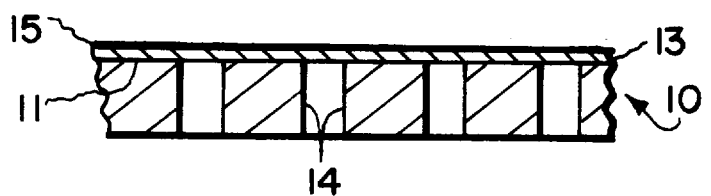
FIG. 2C depicts, in cross-sectional view, the silicon wafer substrate of FIG. 2B, and having a light absorbing layer disposed on the heat insulating layer.

Turning now to FIG. 2C, a light absorbing layer 15 is shown disposed on the insulating layer 13. Generally, an average absorbance of the light absorbing layer should have a value of at least 1.0 over the spectral wavelength range of the radiation source. Depending upon the absorption strength (absorption coefficient) of the material or the materials used in the light absorbing layer, the physical thickness of the light absorbing layer 15 can be in a range from about 0.1 micrometer to several micrometers. Any absorptive materials compatible with the processing of a silicon wafer substrate are useful. Preferred materials for the light absorbing layer include single layers of chromium, nickel, cobalt, silicon, germanium, and carbon, or alloys of these materials. A multilayer stack of alternating layers of materials, for example of alternating layers of chromium and germanium, can be used to desirably match the absorptive range of the light absorbing layer to the spectral characteristics of the radiation source, and to reduce generally undesirable reflective characteristics of the light absorbing layer.

The substrate, the heat insulating layer, and the light absorbing layer must be durable and preferably useful in multiple processing cycle. Therefore, it is important that the light absorbing layer 15 has high thermal stability, good adhesion to the insulating layer 13, and abrasion resistance to withstand the thermal transfer cycles and any subsequent cleaning processes following each transfer process. Cleaning processes include solvent cleaning, ultrasonic solvent cleaning, gas plasma treatment, scrubbing, and thermal deposition at high temperatures.

Figure 2D:
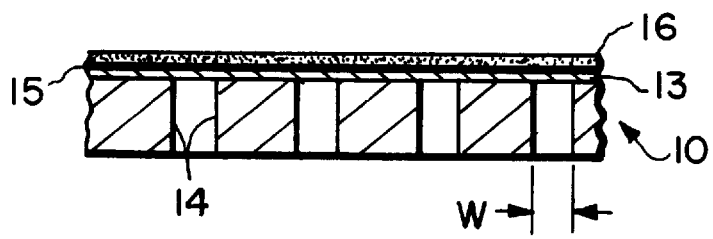
FIG. 2D is a schematic cross-sectional view of the method in accordance with the invention, having a color forming organic donor layer disposed over the light absorbing layer of FIG. 2C.

Turning now to FIG. 2D, there is shown disposed on the light absorbing layer 15, layer 16 of a color forming organic material. This color forming organic material is necessarily a sublimable neat layer and forms a continuous and uniform film upon transfer using the method of the present invention. The desirable characteristics are thermal and photochemical stability, high glass transition temperature, and an organic EL-medium comprised of one or more light-emissive organic materials.

The color forming organic donor layer 16 is deposited on the light absorbing layer 15 to a thickness in the range of from 0.1 to 10 micrometer, preferably by vapor deposition methods.

Examples of color forming colorants which are useful as a donor layer for selective transfer onto an image sensing device to form a color filter thereon include the following: phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177.

Examples of light-emissive organic EL host materials and of fluorescent dyes which are useful as a donor layer for selective transfer onto an organic EL display device to form red, green, or blue light emitting subpixels thereon include the following: 2-methyl-8-hydroquinoline aluminum; 8-hydroquinoline aluminum; coumarin-6; 4-(dicyanoethylene)-2-methyl-6-(p-dimethylamino styryl)-4-H-pyran; quinacridone fluorescent dyes; and perylene fluorescent dyes. Other useful organic EL materials, including light emitting organic host materials and fluorescent dyes used as dopants or as guests in such hosts, are disclosed in commonly assigned U.S. Pat. Nos. 4,769,292, 5,405,709 and 5,683,823, the disclosures of which are included herein by reference.

Ideally, each of the red, green, and blue light-emissive organic EL materials of the respective donor layer would be a single organic material. However, as will be apparent from the above-referenced U.S. patents, red, green, and blue light-emissive layers on respective subpixels of the EL display devices are frequently formed from a light-emissive organic EL host material having one or more fluorescent dyes incorporated in the light-emissive layer in order to achieve a desired brightness of light emission and a desired color or hue of the emitted light from the EL display device. Thus, the method of the present invention will include a donor layer 16 (116) for each of the colors which is a layer of a heat-sublimable organic EL-medium comprised of at least one light-emissive organic material.

Figure 2E:
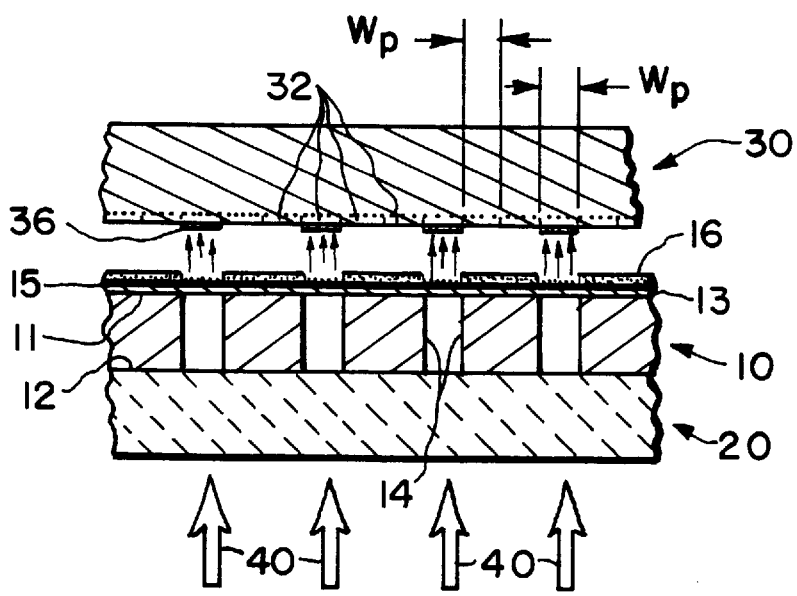
FIG. 2E depicts, in cross-sectional view, the method in accordance with the invention in which the second surface of the silicon wafer substrate is supported by a light transmissive support being exposed by a light exposure to provide selective transfer of the color forming organic donor layer from the substrate to a device having pixels or subpixels.

Referring now to FIG. 2E, there are shown in schematic cross-sectional view, a light transmissive support 20 disposed in contact with the second surface 12 of the substrate 10 having on its first surface 11, in sequence, the layers 13, 15, and 16 depicted in FIG. 2D. The light transmissive support 20 can be placed in contact with the second surface 12 of the substrate 10, or the light transmissive support 20 can be bonded to the surface 12 of the substrate. Preferred materials of the light transmissive support 20 are quartz, pyrex-type glass, soda-lime glass, and rigid plastics.

It will be appreciated from FIG. 2E that the openings 14 in the substrate 10 are substantially sealed by an upper surface of the light transmissive support 20 and by a lower surface of the light transmissive heat insulating layer 13, thereby rendering these openings as substantial thermal insulators compared to the substrate surrounding the openings. Stated differentially, the openings 14 have low thermal mass and low thermal conductivity, while the substrate surrounding the openings 14 has a higher thermal conductivity and a significantly higher thermal mass. It can be said that the configuration of FIG. 2E, comprised of the substrate 10 and the support 20, provides a high thermal contrast between the openings and the substrate material surrounding the openings.

The radiation exposure 40 (light or heat exposure) is shown by the arrows as incident on the lower surface of the light transmissive support 20. Exposure 40, which in this example is incident on both the substrate 10 as well as on the openings 14 therein, will not significantly increase the temperature of the substrate having the relatively high thermal mass, but will significantly increase the temperature of the light absorbing layer 15 in regions coincident with the openings 14, thereby rapidly vaporizing the color forming organic donor layer 16 in regions coincident with the openings.

A device 30 having a plurality of pixels or subpixels 32 is shown for purposes of clarity of presentation as being spaced from an upper surface of the donor layer 16. Each pixel (subpixel) is shown for illustrative purposes as having a width dimension $W_p$. Prior to initiation of the light exposure 40, the device 30 is oriented or aligned with respect to the substrate 10, such that the pixels 32 are oriented with respect to corresponding openings 14 of the substrate. The selective transfer of the color forming organic donor layer 16 of one color to designated pixels 32 of the device 30 is indicated schematically by dashed arrows in the regions coincident with the openings 14, such selective transfer forming a color organic layer 36 on each one of designated pixels or subpixels of the device 30.

As indicated above, the device 30 can be an image sensing device of the CCD or of the CMOS device structure having a color filter of designated red, green, and blue color pixels or color subpixels, and alternatively, the device 30 can be an EL display device having designated red, green, and blue light emitting subpixels.

In the practice of the invention, the device 30 is positioned in contact or close proximity to the donor layer 16 in an oriented relationship between the openings 14 and the corresponding subpixels 32. When the device is an image sensing device, each of the designated color pixels or subpixels 32 is generally substantially covered by the corresponding red, green, or blue selectively transferred colorant layer to form respective color filter layers 36. In this case, a width dimension $W_p$ of each pixel is fully covered with a color filter layer 36, and $W \leq W_p$. As expected, the highest resolution of transferred layers 36 is obtained when the image sensing device is positioned in contact with the donor layer 16. However, it has been found that a resolution of transferred layers 36 can be obtained which is adequate in image sensing devices when the image sensing device is positioned in close proximity to the donor layer 16 within a proximate spacing of less than or equal to the pixel width dimension $W_p$.

When the device is an EL display device in which each subpixel is to be fully active as a light emitter which emits red, green, or blue light, the above considerations pertain with respect to contact or proximity positioning between an EL display device and a color forming organic donor layer 16. However, as is well known in the art of EL display devices, the active or light emitting area of an EL subpixel is frequently designed to be significantly smaller than the geometrical subpixel area. In such instances the dimensions of the openings 14 (i.e. of the shown width dimension W) in the substrate 10 of the inventive apparatus are scaled such that a transferred layer of a color organic EL-medium is formed over only a fraction of an EL subpixel width dimension $W_p$. In this latter case, $W<<W_p$ and a proximity position between an EL device and an EL organic donor layer 16 is within a proximate spacing of less than or equal to the width dimension W of the openings 14 in the substrate 10 of the apparatus.

The exposure 40 is depicted here as providing a blanket radiation exposure substrate. Such blanket exposure can be directed to provide uniform exposure of a portion of the substrate or of the entire substrate. A blanket exposure can be obtained from a pulsed radiation source, for example, from a pulsed gas discharge lamp. The radiation exposure 40 can also be provided from a scanning light source, for example, from a scanning laser beam light source. The intensity of the exposure 40 and the duration of the exposure are selected such that sufficient energy is transferred through the openings 14 to the light absorbing layer 15 to produce sufficient heat at the light absorbing layer over the openings 14 so that the transferrable color forming organic donor layer 16 will selectively transfer to the pixels 32 of the device 30 in regions coincident with the openings 14 in the substrate 10.

Figure 3A:
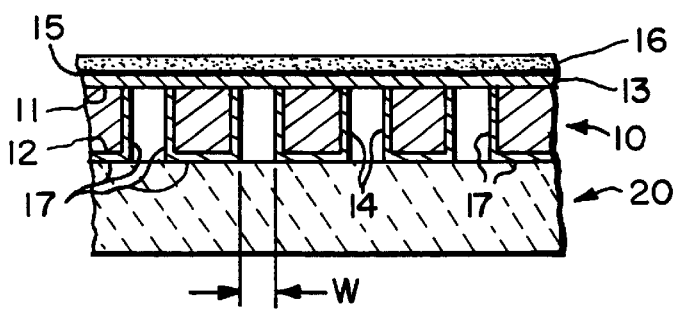
FIG. 3A is a cross-sectional view of the method in accordance with the invention in which a light reflecting layer is shown disposed on side walls of the openings and along the second surface of the silicon wafer substrate between the openings.

Turning now to FIG. 3A, there is shown a schematic cross-sectional view of a method for selective transfer of a color forming organic donor layer in which like numerals designate like parts and functions. The substrate 10 has a light reflecting layer 17 extending along the side walls of the openings 14 and along the second surface 12 between the openings, thereby substantially eliminating radiation absorbance of the substrate. The light reflecting layer 17 can be a reflecting chromium layer or a silver layer deposited by electroplating onto the substrate when the substrate is an electrically semiconductive silicon substrate. The heat insulating layer 13 will not be coated with the light reflecting layer 17 since it is an electrically insulating layer. Alternatively, the light reflecting layer 17 can be a chromium, silver, or aluminum reflecting layer vapor deposited under an angled arrangement between a vapor source and the substrate 10. It is understood that the formation of the light reflecting layer 17 takes place prior to providing the light transmissive support 20 on the second surface of the substrate 10, and prior to deposition of the color forming organic donor layer 16 on the light absorbing layer 15.

Figure 3B:
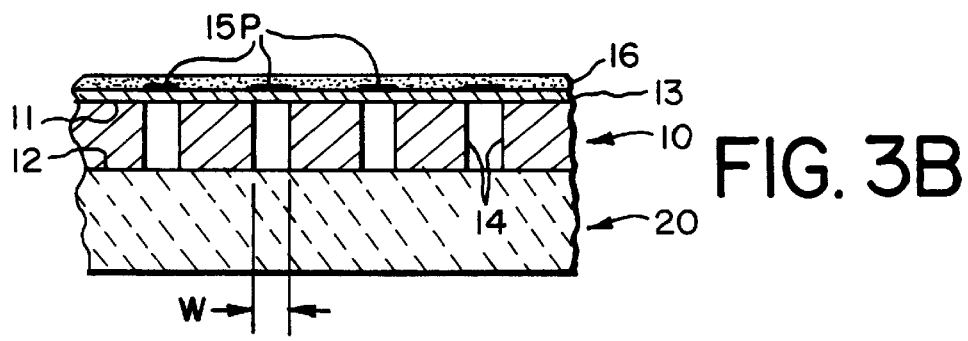
FIG. 3B is a cross-sectional view of the method in accordance with the invention in which the light absorbing layer is shown as a patterned light absorbing layer.

Referring now to FIG. 3B, there is shown a schematic cross-sectional view of a method for selective transfer of a color organic layer from a color forming organic donor layer 16 in which light absorbers 15P are patterned to be coincident with the openings 14 in the substrate 10, thereby thermally isolating individual light absorbing layers 15P from one another.

To provide the highest thermal contrast between the openings 14 in the substrate 10 and the substrate portions between the openings, the light reflecting layer 17 of FIG. 3A can be combined with the patterned light absorbing layer 15P of FIG. 3B.

Figure 4A:
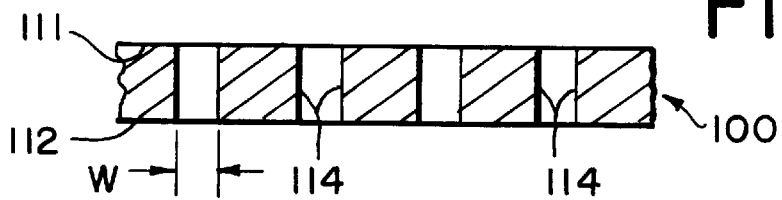
FIG. 4A is a schematic cross-sectional view of a silicon wafer substrate in accordance with a second embodiment of the invention, having openings extending between a second and a first surface of the substrate, the cross-section taken along the line 4A—4A shown in parentheses in FIG. 1.

Turning now to FIG. 4A, there is depicted a schematic cross-sectional view of a substrate 100 having a first surface 111 and an opposing second surface 112 in which openings 114 of a width dimension W extend from the second surface to the first surface. In this second embodiment of the method of the invention, the previously described heat insulating layer 13 is not used.

Figure 4B:
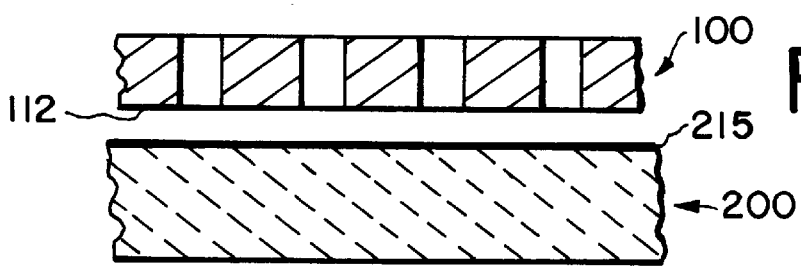
FIG. 4B depicts, in schematic cross-sectional view, the silicon wafer substrate of FIG. 4A and spaced therefrom for illustrative purposes, a light transmissive support having a light absorbing layer thereon.

Turning now to FIG. 4B, there is depicted the substrate 100 and a light transmissive support 200 having a light absorbing layer 215 disposed on an upper surface thereof.

Figure 4C:
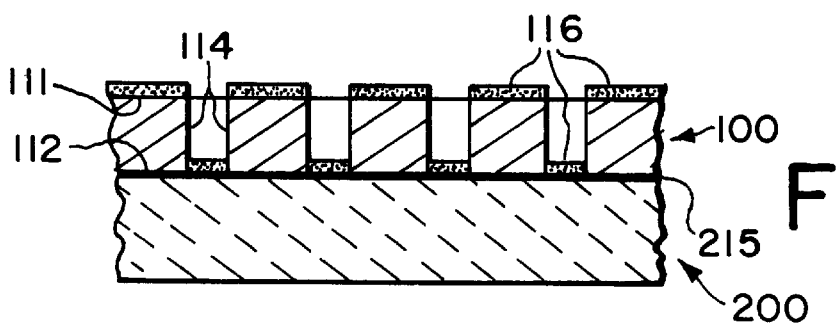
FIG. 4C shows the method in accordance with the second embodiment of the present invention in which the light transmissive support with the light absorbing layer thereon is disposed in contact with the second surface of the silicon wafer substrate, and a color forming organic donor layer is shown disposed on the light absorbing layer in the openings and on the first surface of the substrate between the openings.

Referring now to FIG. 4C, the light absorbing layer 215 on the light transmissive support 200 is shown in contact with the second surface 112 of the substrate 100. A color forming organic donor layer 116 is formed in the openings 114 on the light absorbing layer 215 and on the first surface 111 between the openings 114.

The donor layer 116 can be formed by vapor deposition from a collimated vapor source.

Figure 4D:
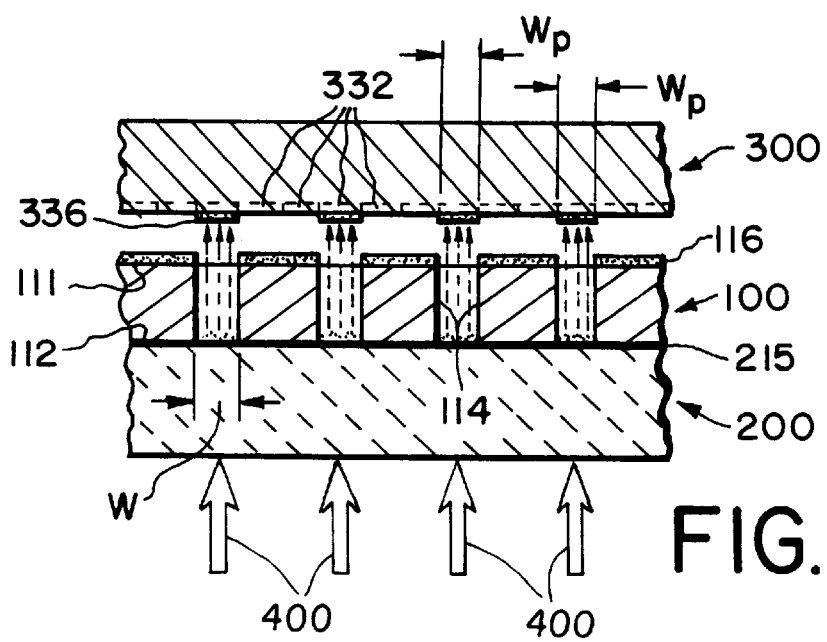
FIG. 4D depicts, in cross-sectional view, the method in accordance with the second embodiment of the invention in which a light exposure through the light transmissive support is shown as having provided a selective transfer of the color forming organic donor layer from the light absorbing layer through the openings onto a device having a plurality of pixels.

Turning now to FIG. 4D, there is shown in a schematic cross-sectional view, the method for selective transfer of a color organic layer depicted in FIG. 4C in which a radiation exposure 400 is incident on the light transmissive support 200 and is absorbed by the light absorbing layer 215, thereby causing vaporization of the color forming organic donor layer previously disposed on the light absorbing layer within the openings 114 in the substrate 100. The transfer of the color forming organic donor layer through the openings 114 is schematically indicated by dotted arrows, and provides a selectively transferred color organic layer 336 on designated pixels 332 of a device 300, which is shown for illustrative purposes only to be spaced from an upper surface of the donor layer 116 between the openings 114. As indicated above with reference to FIG. 2E, the device 300 is positioned prior to exposure in contact or close proximity to the upper surface of the donor layer 116 in an oriented relationship between the pixels 332 and corresponding openings 114 in the substrate, with close proximity being a spacing smaller than or equal to $W_p$ for full pixel coverage, where $W \leq W_p$, or is smaller than or equal to W for fractional pixel coverage of EL display devices where $W << W_p$, as detailed above in the discussion of FIG. 2E.

As described with reference to FIG. 2E, the exposure 400 can be a blanket exposure provided by a pulsed gas discharge lamp and, alternatively, it can be radiation from a scanning laser light beam. The light transmissive support 200 with the light absorbing layer 215 thereon can be bonded to the second surface 112 of the substrate 100.

After the selective transfer to designated subpixels of a device of one color (for example, a red color) of a color organic layer from a color forming donor layer employing either one of the embodiments of the inventive method, donor layer residue is removed from the substrate by suitable cleaning processes. A donor layer capable of forming another color (for example, a green color) is then deposited on the substrate. The device is repositioned via orientation marks with respect to the donor layer of such other color in an oriented relationship between the openings 14 (114) and the designated subpixels 32 (332) corresponding to the other color. Selective transfer of this donor layer to the designated subpixels of the device then commences by employing a source of radiation as detailed above. The sequence of cleaning, donor layer deposition, device repositioning, and selective donor layer transfer is repeated to form the third color (for example, a blue color) organic layer on the corresponding designated subpixels of the device 30 (300).

The invention has been described in detail with particular reference to certain preferred embodiments thereof, but it will be understood that variations and modifications can be effected within the spirit and scope of the invention.

For example, it will be appreciated that the plurality of openings 14 or 114 depicted in FIG. 1 are shown for illustrative purposes only. The number of openings, the shape of openings, and the spacing between openings, also referred to as pitch, in a method in accordance with the present invention, will be selected to match the number, shape, and pitch of pixels of a device which is to receive the selectively transferred color organic layer. It will also be appreciated that both image sensing and organic EL display devices are available in numerous differing configurations. Accordingly, the method for selectively transferring a color organic layer to designated pixels or subpixels of a particular one of such numerous devices will be adapted to be operative with respect to such a particular device.

| PARTS LIST | |
| --- | --- |
| 10 | substrate |
| 11 | first substrate surface |
| 12 | second substrate surface |
| 13 | heat insulating layer |
| 14 | openings |
| 15 | light absorbing layer |
| 15P | patterned light absorbing layer |
| 16 | color forming organic donor layer |
| 17 | light reflecting layer |
| 20 | light transmissive support |
| 30 | device |
| 32 | color pixels or subpixels |
| 36 | selectively transferred color organic layer |
| 40 | radiation exposure |
| 100 | substrate |
| 111 | first substrate surface |
| 112 | second substrate surface |
| 114 | openings |
| 116 | color forming organic donor layer |
| 200 | light transmissive support |
| 215 | light absorbing layer |
| 300 | device |
| 332 | color subpixels |
| 336 | selectively transferred color organic layer |
| 400 | radiation exposure |

What is claimed is:

1. A method for selective transfer of a color organic layer from a donor layer onto a device having an array of pixels with each pixel formed from a number of color subpixels having selected positions in the array, comprising the steps of:

a) providing a substrate having opposing first and second surfaces;

b) forming a light transmissive heat insulating layer over the first surface of the substrate;

c) forming a light absorbing layer over the heat insulating layer;

d) providing the substrate with an array of openings extending from the second surface to the heat insulating layer, the number and positions of the openings corresponding to the number and positions of the color subpixels of the device, and each opening having a size equal to or smaller than the size of the color subpixel;

e) providing a transferable color forming organic donor layer formed on the light absorbing layer;

f) positioning the device in contact or close proximity to the donor layer in an oriented relationship between the openings in the substrate and the corresponding color subpixels on the device; and g) employing a source of radiation for producing sufficient heat at the light absorbing layer over the openings to cause the selective transfer of portions of the transferable color forming organic donor layer to the corresponding color subpixels of the device.

2. The method of claim 1 in which each pixel is formed with red, green, and blue color subpixels and further including the step of repositioning the device with respect to a transferable color forming organic donor layer of another color in an oriented relationship between the openings and the subpixels corresponding to such other color.

3. The method of claim 1 wherein the device is an image sensing device and the transferable color forming organic donor layer is a layer of a heat-sublimable organic colorant capable of forming a color filter.

4. The method of claim 1 wherein the device is an electroluminescent (EL) display device and the transferable color forming organic donor layer is a layer of a heat-sublimable organic EL-medium comprised of at least one light-emissive organic material.

5. The method of claim 1 wherein the heat insulating layer is a material selected from the group consisting of silicon dioxide, silicon nitride, silicon oxynitride, and aluminum oxide.

6. The method of claim 5 wherein the heat insulating layer has a thickness in the range of from 0.1 to 50 micrometer.

7. The method of claim 1 wherein the openings have a width dimension in the range of from 2 to 300 micrometer.

8. The method of claim 1 wherein the light absorbing layer is a material selected from the group consisting of absorptive chromium, nickel, cobalt, silicon, germanium, carbon, and a multilayer stack of alternating layers of such group of materials.

9. The method of claim 8 wherein the light absorbing layer is patterned so as to remain on the heat insulating layer over the openings in the substrate.

10. The method of claim 1 including a light reflecting layer disposed over sidewalls of the openings and over the second surface of the substrate between the openings.

11. The method of claim 1 further including a light transmissive support for supporting the second surface of the substrate having the openings.

12. The method of claim 1 wherein the radiation source includes a light source which provides a blanket radiation exposure.

13. The method of claim 1 wherein the radiation source includes a scanning light source.

14. The method of claim 1 wherein the substrate is selected from the group consisting of a silicon wafer, a glass plate, and a ceramic plate.

* * * * *